(12) United States Patent
Matsumoto et al.

(10) Patent No.: US 7,984,545 B2
(45) Date of Patent: Jul. 26, 2011

(54) APPROACHES FOR MANUFACTURING A HEAD GIMBAL ASSEMBLY

(75) Inventors: Yuhsuke Matsumoto, Kanagawa (JP); Tatsumi Tsuchiya, Kanagawa (JP); Hideto Imai, Kanagawa (JP); Tamaki Ushimoto, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 441 days.

(21) Appl. No.: 12/220,746

(22) Filed: Jul. 25, 2008

(65) Prior Publication Data
US 2009/0025205 A1    Jan. 29, 2009

(30) Foreign Application Priority Data
Jul. 27, 2007   (JP) .................................. 2007-195437

(51) Int. Cl.
*G11B 5/127* (2006.01)
*H04R 31/00* (2006.01)

(52) U.S. Cl. ............... 29/603.03; 29/603.04; 29/603.06; 29/603.07; 29/854; 228/181; 228/190; 360/121; 360/122; 360/244.1; 360/250; 360/317

(58) Field of Classification Search ............... 29/603.03, 29/603.04, 603.06, 603.07, 854; 228/181, 228/190; 360/121, 122, 244.1, 250, 317
See application file for complete search history.

(56) References Cited

U.S. PATENT DOCUMENTS
6,742,694 B2    6/2004   Satoh et al.
2001/0013227 A1*   8/2001   Lang et al. ...................... 62/374

FOREIGN PATENT DOCUMENTS
| JP | 08-309519 A | 11/1996 |
| JP | 09-246707 A | 9/1997 |
| JP | 2001-196735 A | 7/2001 |
| JP | 2003-205386 A | 7/2003 |

* cited by examiner

*Primary Examiner* — Paul D Kim
(74) *Attorney, Agent, or Firm* — Mahamedi Paradice Kreisman LLP; Christopher J. Brokaw

(57) ABSTRACT

Approaches for helping to decrease the amount of inactive gas necessary for reflow to interconnect connection terminals of a head slider and a suspension. Inactive gas is blown from a nozzle of a reflow apparatus toward interconnection joints of a head slider and a suspension. The head slider is bonded onto a gimbal tongue. The nozzle comprises a duct through which the inactive gas passes and a porous member fitted in an ejection outlet of the tube. Placing the porous member close to the head slider achieves effective reduction of oxygen concentration around solder balls.

5 Claims, 8 Drawing Sheets

APPROACHES FOR MANUFACTURING A HEAD GIMBAL ASSEMBLY

CROSS-REFERENCE TO RELATED APPLICATION

The instant nonprovisional patent application claims priority to Japanese Patent Application No. 2007-195437 filed Jul. 27, 2007 and which is incorporated by reference in its entirety herein for all purposes.

BACKGROUND OF THE INVENTION

Devices using various kinds of media, such as optical disks, magnetic disks, magneto-optical disks, or the like have been known in the art as data storage devices. In particular, hard disk drives (HDDs) have been widely used as storage devices of computers. Moreover, HDDs have found widespread application to moving image recording/reproducing apparatuses, car navigation systems, digital cameras, cellular phones, or the like in addition to computers.

A HDD comprises a head slider for accessing (reading or writing) a magnetic disk and an actuator for supporting the head slider and swinging to move the head slider above the magnetic disk. The actuator comprises a suspension on which the head slider is fixed. The airflow viscosity between the head slider and the spinning magnetic disk balances the force applied to the head slider by the suspension to allow the head slider to fly over the magnetic disk.

Solder ball bonding (SBB) has been known in the art as a technique for electrically connecting wirings of a slider and a suspension. A conventional SBB method disposes solder balls between connection terminals of a slider and those of a suspension and reflows them by laser beam to electrically interconnect the connection terminals of the slider and the suspension. The solder balls are reflowed within an atmosphere of inactive gas such as nitrogen (for example, refer to a Japanese Patent Publication No. 2002-251705 "Patent Document 1").

Recent requests for lead-free materials demand that the above-described solder balls be made of lead-free solder. Lead-free solder has a higher melting point than solder mainly composed of lead. Accordingly, reflowing such solder balls requires high energy. On the other hand, a head element portion on a head slider is a heat-sensitive component and it is important to prevent damage onto the head element portion in a reflow process. Therefore, it is desired to improve the wetting characteristic of solder balls with lower energy. For this improvement in wetting characteristic, it is effective to reduce the oxygen concentration around the solder balls during the reflow process.

The most effective method to reduce the oxygen concentration around the solder balls is to perform the reflow process in a sealed space filled with nitrogen. However, filling the entire room with nitrogen requires much equipment and consumes a huge amount of nitrogen gas. Accordingly, it is necessary to lower the oxygen concentration around the solder balls with less equipment and nitrogen. In order to lower the oxygen concentration around the solder balls, or to increase the density of nitrogen to be blown, it is important to blow nitrogen gas uniformly.

A technique has been known that blows out nitrogen gas through a porous member to attain uniform nitrogen gas (for example, refer to the Patent Document 1). However, since interconnection of a head slider and a suspension requires fine and secure interconnection, merely blowing nitrogen gas through a porous member does not exert sufficient effect for improving wetting characteristic. Accordingly, an effective reflow technique is desired for the interconnection of the head slider and the suspension.

BRIEF SUMMARY OF THE INVENTION

Embodiments of the present invention help to decrease the amount of inactive gas necessary for reflow to interconnect connection terminals of a head slider and a suspension. According to the embodiment of FIG. 5, inactive gas is blown from a nozzle 30 of a reflow apparatus toward interconnection joints of a head slider 121 and a suspension 114. The head slider 121 is bonded onto a gimbal tongue 119. The nozzle 30 comprises a duct 31 through which the inactive gas passes and a porous member 32 fitted in an ejection outlet of the tube 31. Placing the porous member 32 close to the head slider 121 achieves effective reduction of oxygen concentration around solder balls 24.

DETAILED DESCRIPTION OF THE INVENTION

Figure 1:
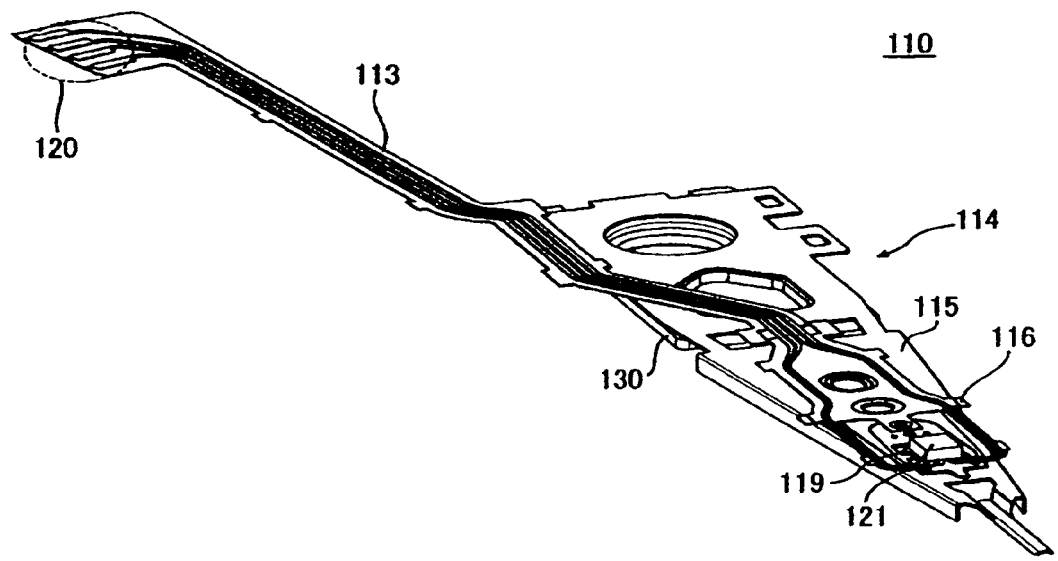
FIG. 1 is a perspective view schematically illustrating the structure of a head gimbal assembly according to one embodiment.

Embodiments of the present invention relate to a method and an apparatus for manufacturing a head gimbal assembly, more particularly to a technique for blowing inactive gas during solder ball reflow in manufacturing a head gimbal assembly.

An aspect of embodiments of the present invention is a method for manufacturing a head gimbal assembly. This method places a head slider on a suspension. It places solder balls for interconnecting terminals of the head slider and terminals of the suspension between the terminals of the head slider and the terminals of the suspension. It interconnects the terminals of the head slider and the terminals of the suspension by solder ball reflow while blowing inactive gas toward the solder balls from a nozzle having a porous member. The nozzle is located in such a manner that an ejection face of the porous member first contacts the head gimbal assembly if the nozzle is brought close to the head gimbal assembly so as to blow the inactive gas ejected from the ejection face of the porous member to the head gimbal assembly. Blowing inactive gas through the porous member located in this manner accomplishes effective reflow for interconnection of the head slider and the suspension.

The head slider may be placed on a tongue of the suspension, the nozzle is positioned opposite the head slider across the tongue, and the laser beam for the reflow is irradiated from the opposite side from the tongue across the head slider. This accomplishes blowing the inactive gas without interruption of the laser irradiation.

In one example, the solder ball reflow is performed with at least a part of the periphery of the head gimbal assembly surrounded by a wall continuing from the nozzle. This accomplishes an increase in inactive gas concentration.

The distance between the ejection face of the porous member and the tongue may be 1 mm or less. This accomplishes a highly effective inactive gas concentration. The vacancy rate of the porous member may be from 70% to 90%. This accomplishes a uniform and sufficient inactive gas concentration.

Another aspect of embodiments of the present invention is an apparatus for manufacturing a head gimbal assembly. This manufacturing apparatus comprises an apparatus for aligning solder balls between connection terminals of a head slider disposed on a suspension and connection terminals of the suspension, a nozzle having a porous member for blowing inactive gas from the suspension to an ejection face of the porous member, and a laser device for irradiating laser to the solder balls in an atmosphere of the inactive gas from the nozzle. A space between the suspension and the ejection face of the porous member and defined by projecting the suspension from the head slider toward the ejection face of the porous member is vacant. This accomplishes an effective reflow for interconnection of the head slider and the suspension.

The head slider may be placed on a tongue of the suspension, the nozzle may be positioned opposite the head slider across the tongue, and the laser device may be positioned opposite the tongue across the head slider. This accomplishes the inactive gas blowing without interruption of the laser irradiation.

In one example, the nozzle has a wall surrounding at least a part of the periphery of the head gimbal assembly. This accomplishes an effective increase in inactive gas concentration.

Embodiments of the present invention accomplish a reduction in the amount of inactive gas necessary for reflow process to interconnect connection terminals of a head slider and a suspension.

Hereinafter, particular embodiments of the present invention will be described. For clarity of explanation, the following description and the accompanying drawings contain omissions and simplifications as appropriate. Throughout the drawings, the like components are denoted by like reference numerals, and their repetitive description is omitted for clarity of explanation if not necessary. Hereinafter, descriptions are given to a hard disk drive (HDD) as an example of a disk drive device. The embodiments feature a technique for blowing inactive gas in a reflow process to interconnect terminals of a head slider and those of a suspension. Before describing the reflow process, a head gimbal assembly (HGA), an assembly of a head slider and a suspension, will be outlined.

Figure 2:
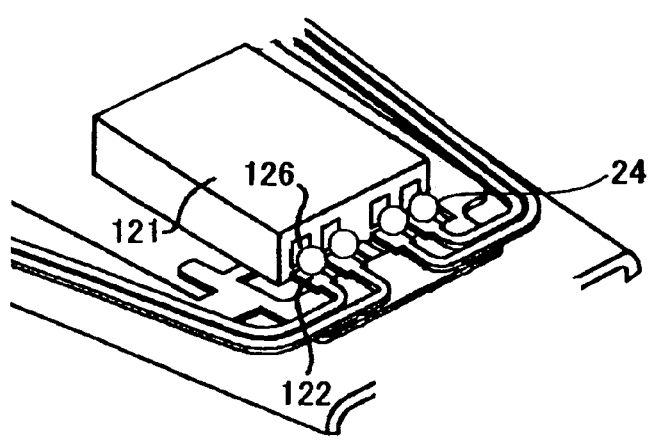
FIG. 2 is a schematic enlarged view of connection terminals of a slider and connection terminals of a lead according to one embodiment.

FIG. 1 is a perspective view showing an example of an HGA 110 to be mounted in an HDD. FIG. 2 is an enlarged view of the vicinity of a head slider 121. The HGA 110 comprises a head slider 121, a trace 113 which are transmittal wirings, and a suspension 114. The head slider 121 comprises a slider and a head element portion. The head element portion includes a magnetoresistive head for reading and an electromagnetic inductive write head. The head element portion may include only either one of the magnetoresistive head and the write head.

The suspension 114 is formed by securing a gimbal 116 on a side of a load beam 115 supporting the head slider 121 and a mount plate 130 on the reverse side from the side of the load beam 115 supporting the head slider 121. The load beam 115 functions as a spring for generating a specific load which balances the flying force of the head slider 121. The gimbal 116 supports the head slider 121 in such a manner that does not interfere with position change of the head slider 121. In addition, a gimbal tongue 119 is formed on the gimbal 116. On the gimbal tongue 119, the head slider 121 is bonded.

The trace 113 for electrically connecting the head slider 121 and a preamplifier IC (not shown) is formed by disposing multiple leads on insulating sheets without contacting each other. An end 120 of the trace 113 is connected to a substrate where the preamplifier IC is placed. At the other end of the trace 113 on the side of the head slider 121, suspension connection terminals 122 are provided as shown in FIG. 2. In the example of FIG. 2, four suspension connection terminals are provided. On the front end surface of the head slider 121, the same number of slider connection terminals 126 as the suspension connection terminals 122 are provided. Each of the suspension connection terminals 122 and each of the slider connection terminals 126 are interconnected by a solder ball 24. This will be described later. FIG. 2 shows solder balls 24 before reflow.

A feature of the present embodiment is a manufacturing method of the HGA 110, and particularly a step of electrically connecting the above-described suspension connection terminals 122 and the slider connection terminals 126. The present embodiment uses the solder ball bonding (SBB) method in this step. The manufacturing steps of an HDD first manufacture a head slider 121. Aside from the head slider 121, they manufacture a suspension 114. Next, they manufacture an HGA 110 by bonding the head slider 121 to the suspension 114. Then, they secure an arm and a VCM coil to the HGA 110 to manufacture a head stack assembly (HSA) which is an assembly of an actuator and a head slider 121. They mount a spindle motor, a magnetic disk, and the like as well as the manufactured HSA within a base, and then secure a top cover to the base. After that, they write servo data onto the magnetic disk and implement a control circuit to finish an HDD.

Figure 3:
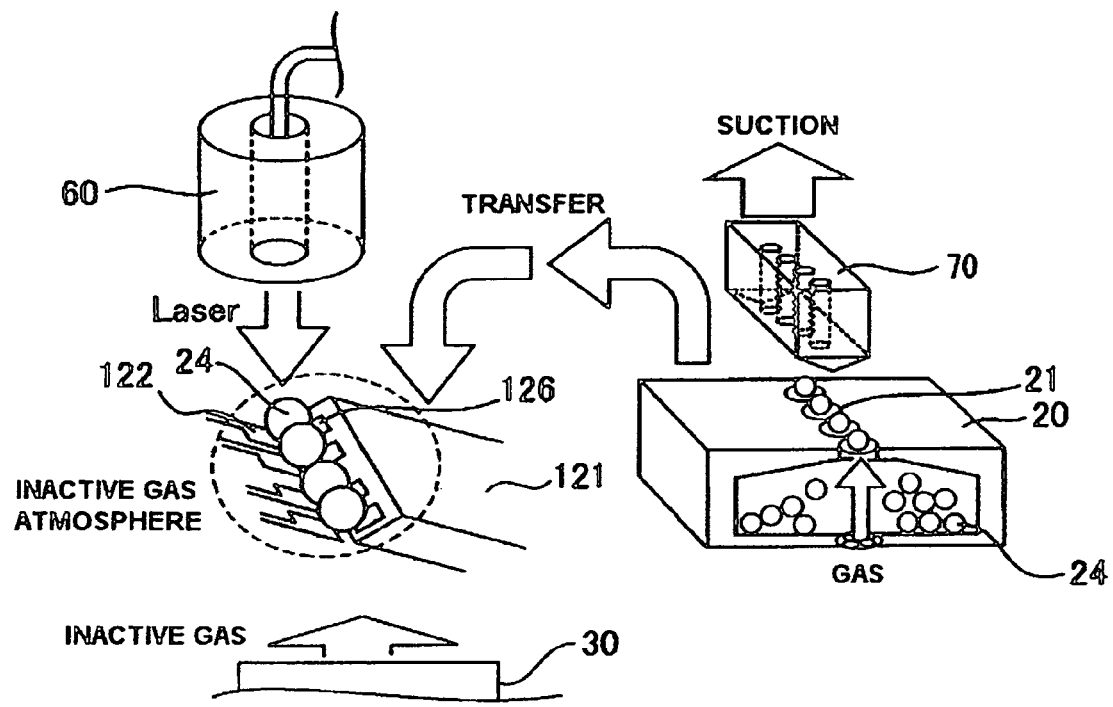
FIG. 3 is a schematic structural drawing of an apparatus for interconnecting connection terminals for a slider and connection terminals for a lead by means of solder balls according to one embodiment.

Hereinafter, the steps for interconnecting the suspension connection terminals 122 and the slider connection terminals 126 in manufacturing an HGA 110 according to the present embodiment will be described in detail. FIG. 3 is a drawing schematically illustrating an apparatus and steps for interconnecting the suspension connection terminals 122 and the slider connection terminals 126.

Solder balls 24 kept in a solder ball supply apparatus 20 are ejected from openings 21 provided on the top surface of the solder ball supply apparatus 20 by blowing out gas from the bottom of the solder ball supply apparatus 20. A vacuum pad 70 sucks the ejected solder balls 24 to transfer the solder balls 24 to above the suspension 114 supporting the slider 121.

Each of the solder balls 24 sucked in the vacuum pad 70 is disposed so as to contact both of each suspension connection terminal 122 and the corresponding slider connection terminal 126.

Then, laser irradiation by an optical device 60 causes the reflow process which melts the solder balls 24 to attain electrical connection between the suspension connection terminals 122 and the slider connection terminals 126. During this reflow process, inactive gas ejected through a nozzle 30 is blown toward the solder balls 24. As a result, the reflow of the solder balls 24 is performed within an inactive gas atmosphere. The kind of the inactive gas is not particularly limited, but typically nitrogen gas is used.

Figure 4A:
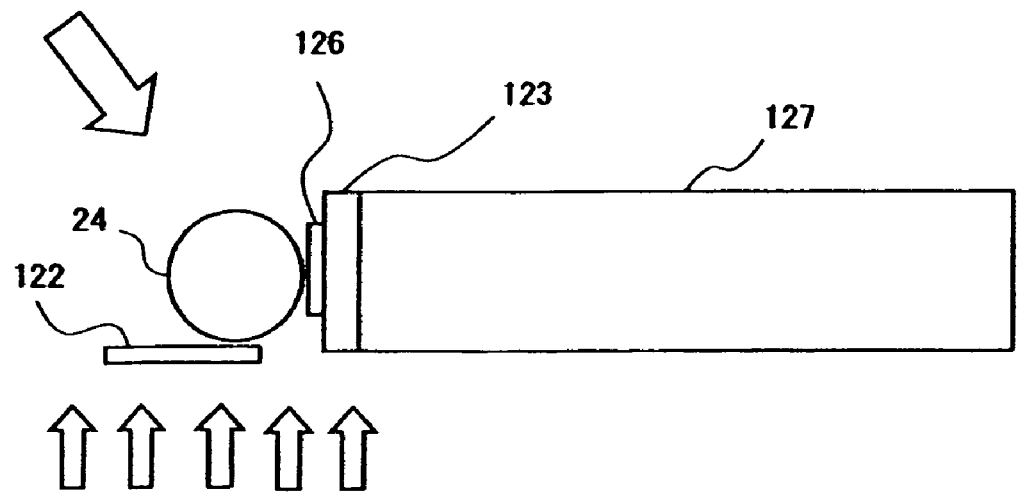
FIGS. 4(a) and 4(b) are views schematically illustrating solder ball reflow for interconnecting connection terminals for a slider and connection terminals for a lead in one embodiment.
Figure 4B:
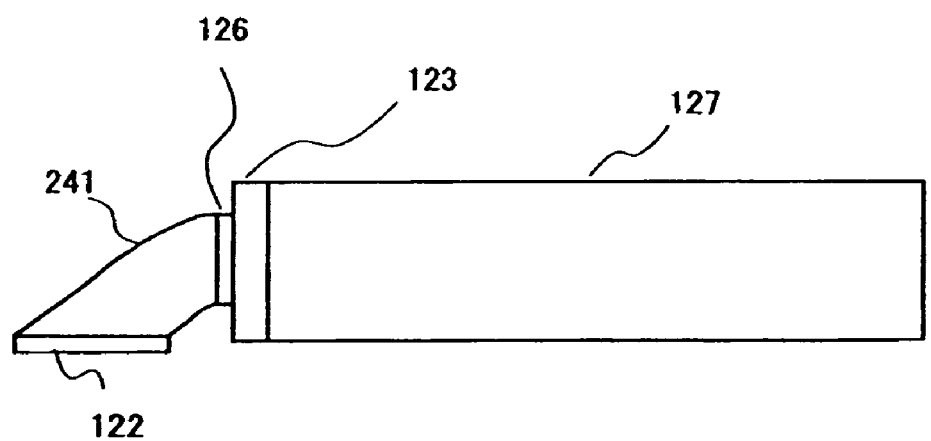

FIG. 4(a) depicts a state of interconnection of a suspension connection terminal 122 and a slider connection terminal 126 before reflow; FIG. 4(b) depicts a state of interconnection of a suspension connection terminal 122 and a slider connection terminal 126 after reflow. Application of energy in laser to a solder ball 24 causes the solder ball 24 to melt so that the suspension connection terminal 122 and the slider connection terminal 126 are interconnected electrically and physically.

During reflow, the slider connection terminals 126, the suspension connection terminals 122 facing them, and four solder balls 24 statically placed in contact with these connection terminals are placed under an inactive atmosphere of inactive gas. Performing solder reflow under an inactive atmosphere of inactive gas allows the inactive gas to surround the solder during the solder reflow, preventing oxidization of the solder balls 24. The melted solder wets and expands on the slider connection terminals 126 and the suspension connection terminals 122 due to the capillary phenomenon and the surface tension of the melted solder to form satisfactory reflow connections (fillets) 241.

Being different from a slider 127, a head element portion 123 can be easily damaged by heat. Since the slider connection terminals 126 are provided in the vicinity of the head element portion 123, it is necessary to reduce the damage caused by thermal energy during reflow. Especially, if the solder balls 24 are made of lead-free solder, the melting point is higher than the one of the eutectic solder. Therefore, high energy is required.

In order to reduce the damage by thermal energy onto the head element portion 123, it is necessary to relax laser conditions and decrease the energy. For this purpose, it is effective to reduce the oxygen concentration around the solder balls 24 during reflow and improve the wetting characteristic of the solder. The HGA manufacturing apparatus of the present embodiment contains a porous member fitted inside a nozzle 30 for ejecting inactive gas. Ejecting the inactive gas through the porous member allows the inactive gas to be blown more uniformly. This reduces the oxygen concentration around the solder balls 24 with a smaller flow amount of inactive gas.

Figure 5A:
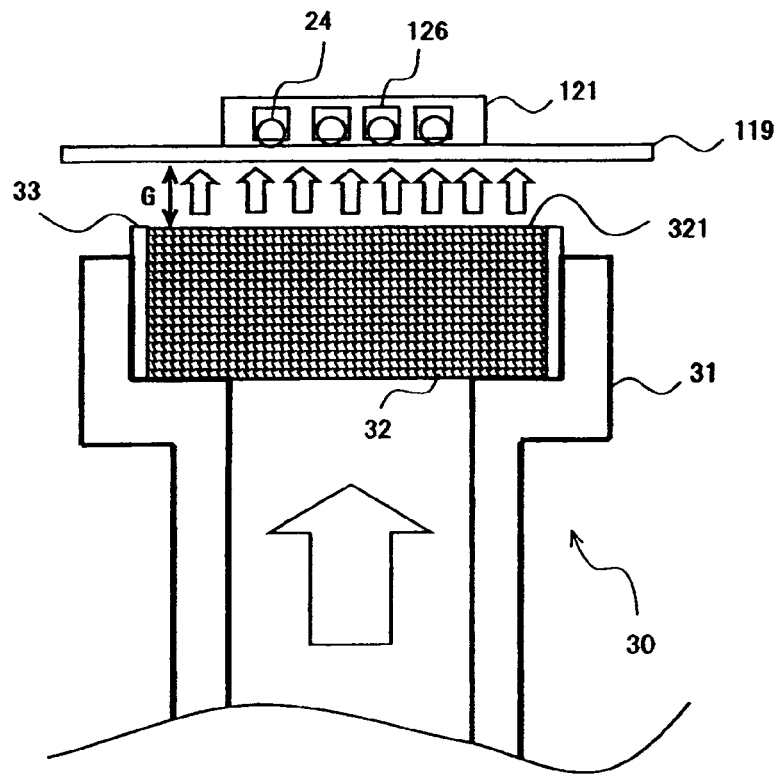
FIGS. 5(a) and 5(b) are views schematically illustrating a nozzle and inactive gas ejected from the nozzle during the solder ball reflow in one embodiment.
Figure 5B:
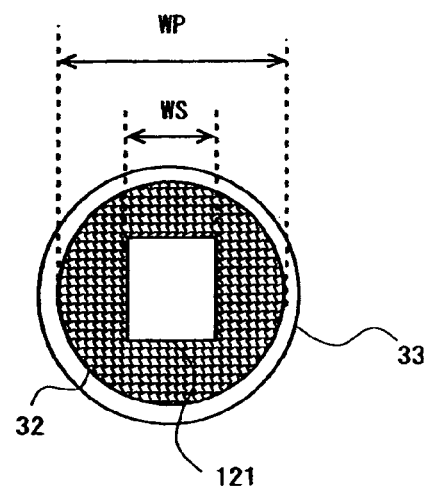

FIG. 5(a) schematically illustrates the inactive gas blowing from the nozzle 30 of the present embodiment to the interconnection joint between the head slider 121 and the suspension 114. In FIGS. 5(a) and 5(b), a gimbal tongue 119, which is a part of the suspension 114, is shown and a head slider 121 is bonded onto the gimbal tongue 119.

The nozzle 30 comprises a duct 31 through which the inactive gas passes and a porous member 32 fitted in the ejection outlet of the duct 31 (the nozzle 30). As shown in FIG. 6(b), the circumference of the porous member 32 is surrounded by a frame body 33. The frame body 33 is made of a high density material which is impermeable to the inactive gas. Therefore, the inactive gas will not leak out through the side surface of the porous member 32. As shown in FIG. 6(b), the porous member 32 of the present example is cylindrical. As illustrated in FIG. 5(a), the inactive gas blows out from the bottom surface of the porous member 32 toward the top surface. The shape of the porous member 32 is selected as appropriate according to the design.

Figure 6A:
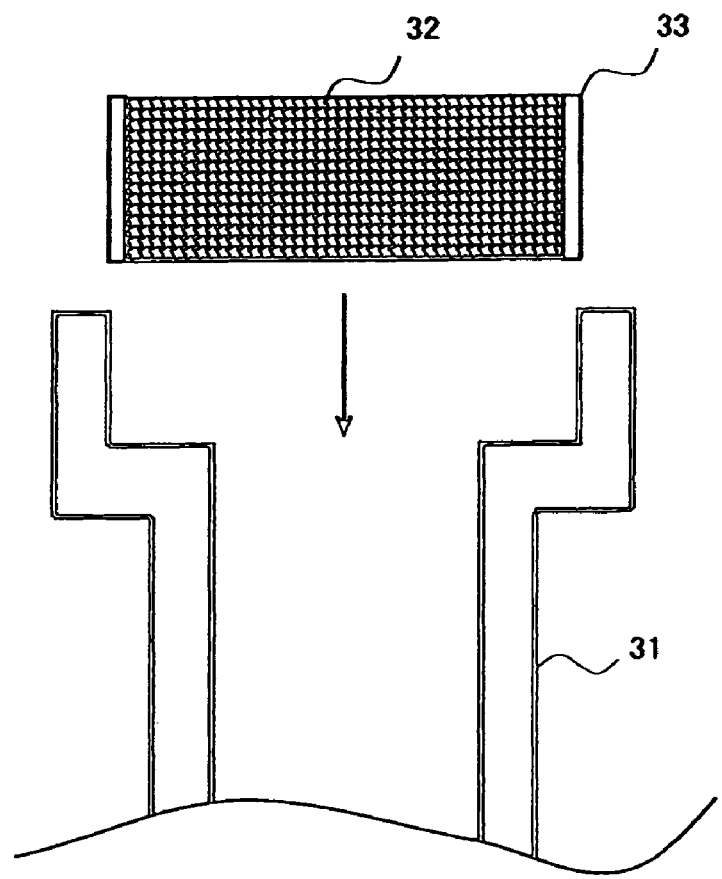
FIGS. 6(a) and 6(b) are views schematically illustrating a nozzle for ejecting inactive gas and a porous member to be fitted therein in one embodiment.
Figure 6B:
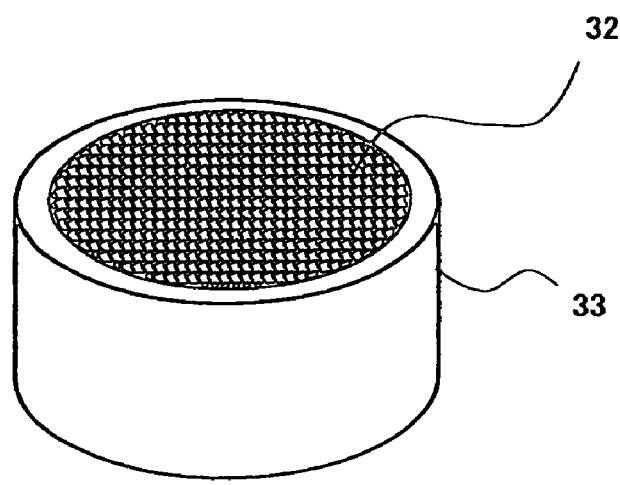

As shown in FIG. 6(a), the porous member 32 may be removably fitted in the nozzle 30. The porous member 32 and the frame body 33 are formed integrally; this porous unit is fitted in the ejection outlet of the duct 31. The porous member 32 is securely fitted in the ejection hole of the duct 31 so as not to move by ejection of the inactive gas. This enables appropriate selection and easy replacement of a porous member corresponding to the HGA 110 or other components in the HGA manufacturing apparatus. Typically, the porous member 32 is made of resin such as urethane and the frame body 33 is made of resin, metal, or the like.

As illustrated in FIG. 5(a), the nozzle 30 may be located opposite the head slider 121 across the gimbal tongue 119 (suspension 114). Since the laser beam needs to be irradiated from the source located at the head slider's side of the suspension 114, the nozzle 30 placed opposite the head slider 121 does not allow itself to interrupt the laser irradiation.

Blowing the inactive gas brings the ejection end face 321 of the porous member 32 as close as possible to the head slider 121 (solder balls 24). If the nozzle 30 is positioned opposite the head slider 121 as shown in FIGS. 5(a) and 5(b), it is important that the gap G between the ejection end face 321 of the porous member 32 and the gimbal tongue 119 be narrower. If the ejection end face 321 is far from the head slider 121, the air flow caused by the ejection of the inactive gas sucks the surrounding air so that the oxygen concentration around the solder balls 24 increases. Bringing the ejection end face 321 close to the head slider 121 prevents the air from being suck to suppress increase in the oxygen concentration around the solder balls 24.

It is important that the nozzle 30 have a structure which can decrease the distance between the ejection end face 321 and the head slider 121 and be placed in such a position. To this end, bringing the ejection end face 321 close to the solder balls 24 should not be prevented by interference between the parts other than the ejection end face 321 of the nozzle 30, such as the duct 31 or the frame body 33, and the HGA 110 (the suspension 114 and the head slider 121). Specifically, the structure and the position of the nozzle 30 are determined so that the ejection end face 321 will first contact the HGA 110 if the ejection end face 321 is brought toward the solder balls 24.

In the example of FIG. 5(a), if the nozzle 30 is brought close to the HGA 110, the ejection end face 321 first contacts the gimbal tongue 119. In such a situation, the design can freely determine the gap between the ejection end face 321 and the HGA 110 by blowing out inactive gas from the porous member 31.

Figure 7:
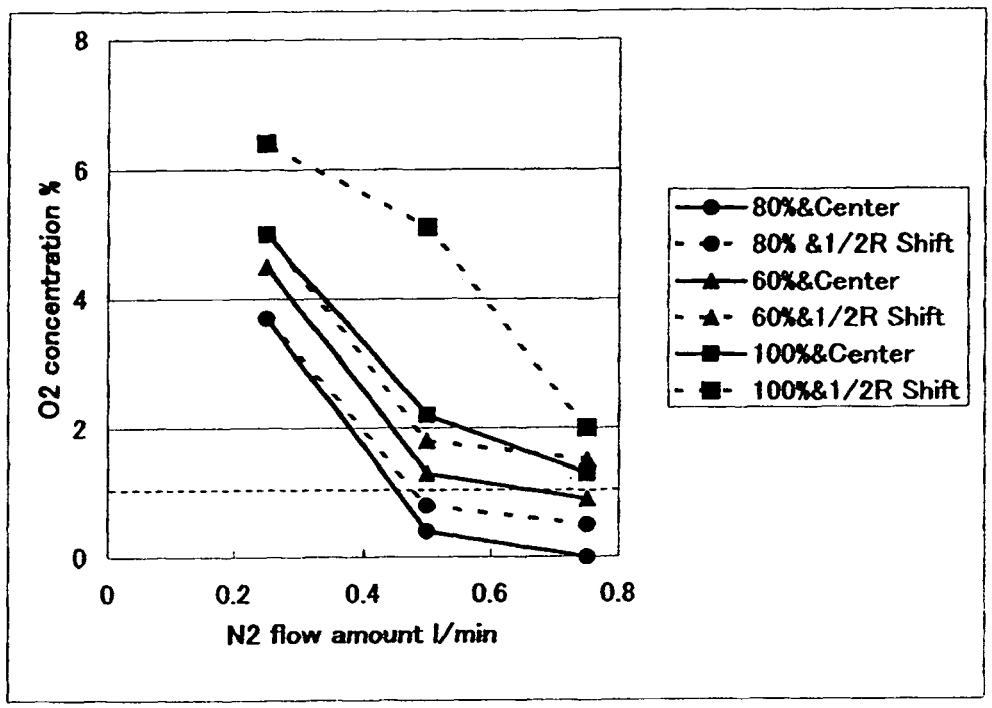
FIG. 7 is a drawing depicting measurements of the relationship of the distance between a head slider and an ejection end face of the porous member and the oxygen concentration around the solder balls in one embodiment.

FIG. 7 depicts measurements of the relationship of the distance between the head slider 121 and the ejection end face 321 of the porous member 32 and the oxygen concentration around the solder balls 24 when inactive gas is blown out from the nozzle 30 positioned opposite from the head slider 121. The CENTERs and ½R SHIFTs in FIG. 7 denote measurements at the central position with respect to the effective diameter of the ejection end face and the measurements at the position shifted from the center by a half of the radius R, respectively. As seen from the relationship shown in FIG. 7, the distance between the gimbal tongue 119 and the ejection end face 321 is preferably 1 mm or less. Of course, it is necessary for the ejection end face 321 not to contact the HGA 110. Meanwhile, the distance between the gimbal tongue 119 and the ejection end face 321 is the distance between the ejection end face 321 and the surface of the gimbal tongue opposite from the surface on which the head slider 121 is bonded.

As understood from the above description, it is important that nothing exist in the space which is between the suspension 114 and the ejection face 321 of the porous member 32 and defined by projecting the suspension 114 from the head slider 121 toward the ejection face 321 and that the space be vacant. Such an arrangement of the nozzle 30 and the HGA 110 does not allow the other part of the nozzle 30 to interfere with bringing the ejection end face 321 close to the head slider 121.

The flow amount and flow rate of the inactive gas from the porous member 32 are determined so that the oxygen concentration can be reduced sufficiently and the solder balls do not move by the inactive gas. In order to attain necessary oxygen concentration with a smaller flow amount of the inactive gas, the vacancy rate in the porous member 32 is an important factor. Too small of a vacancy rate leads to reduction of uniformity effect of the nitrogen gas. On the other hand, too large of a vacancy rate causes a disadvantage in obtaining a sufficient effective ejection area. From these points of view, the vacancy rate in the porous member 32 is preferably from 70% to 90%.

Figure 8:
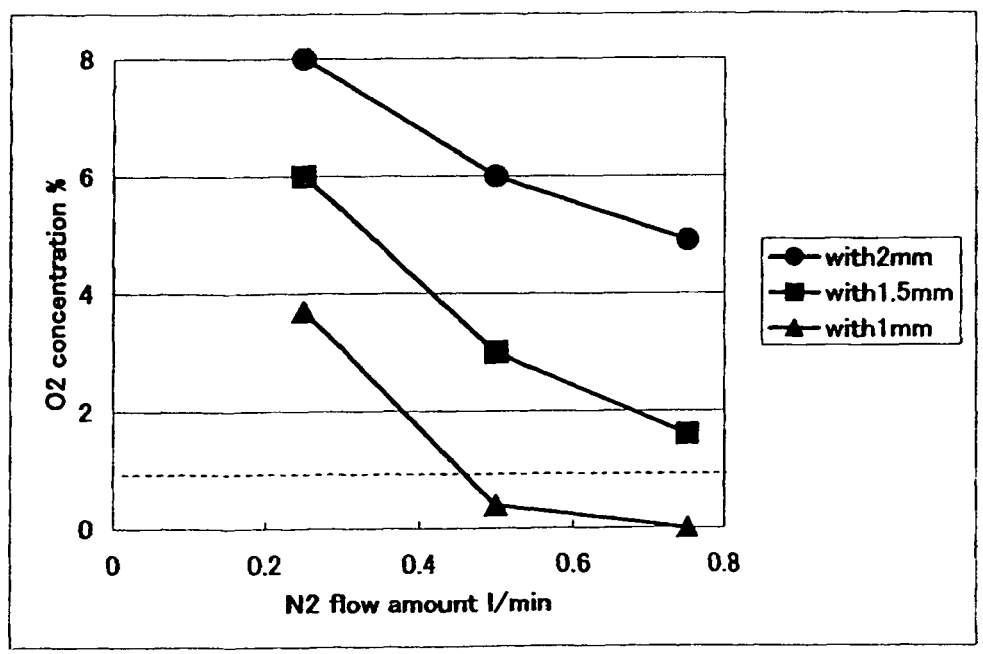
FIG. 8 is a drawing depicting measurements of the relationship of the vacancy rate in the porous member and the oxygen concentration in one embodiment.

FIG. 8 depicts measurements of the relationship of the vacancy rate in the porous member 32 and the oxygen concentration. The position of the nozzle is the same as the example in FIG. 5 and the distance between the head slider 121 and the ejection end face 321 is set to 1 mm. Measurements have been made with use of a porous member 32 with a vacancy rate of 60%, a porous member 32 with a vacancy rate of 80%, and no porous member 32. The vacancy rate in the case of using no porous member 32 is 100%. As seen from the relationship of FIG. 8, the porous member 32 with the vacancy rate of 80% shows preferable results.

It is necessary that all the solder balls 24 be in an inactive gas atmosphere during reflow. Therefore, it is important that all the solder balls 24 are positioned to overlap with the ejection face 321 of the porous member 32 in the direction of the ejection of inactive gas, namely in the direction orthogonal to the mounting surface of the head slider 121 in the example of FIG. 5(a). In order to attain stable low oxygen concentration, the width WP of the ejection face 321 is preferably larger than the width WS of the head slider 121 (the size in the alignment direction of solder balls 24). In addition, it is preferable that the entire head slider 121 be positioned to overlap with the ejection face 321 as shown in FIG. 5(b). The shape of the ejection face 321 may be selected as appropriate from a circle, a half circle, a rectangle, and other polygonal shapes according to the design.

Figure 9:
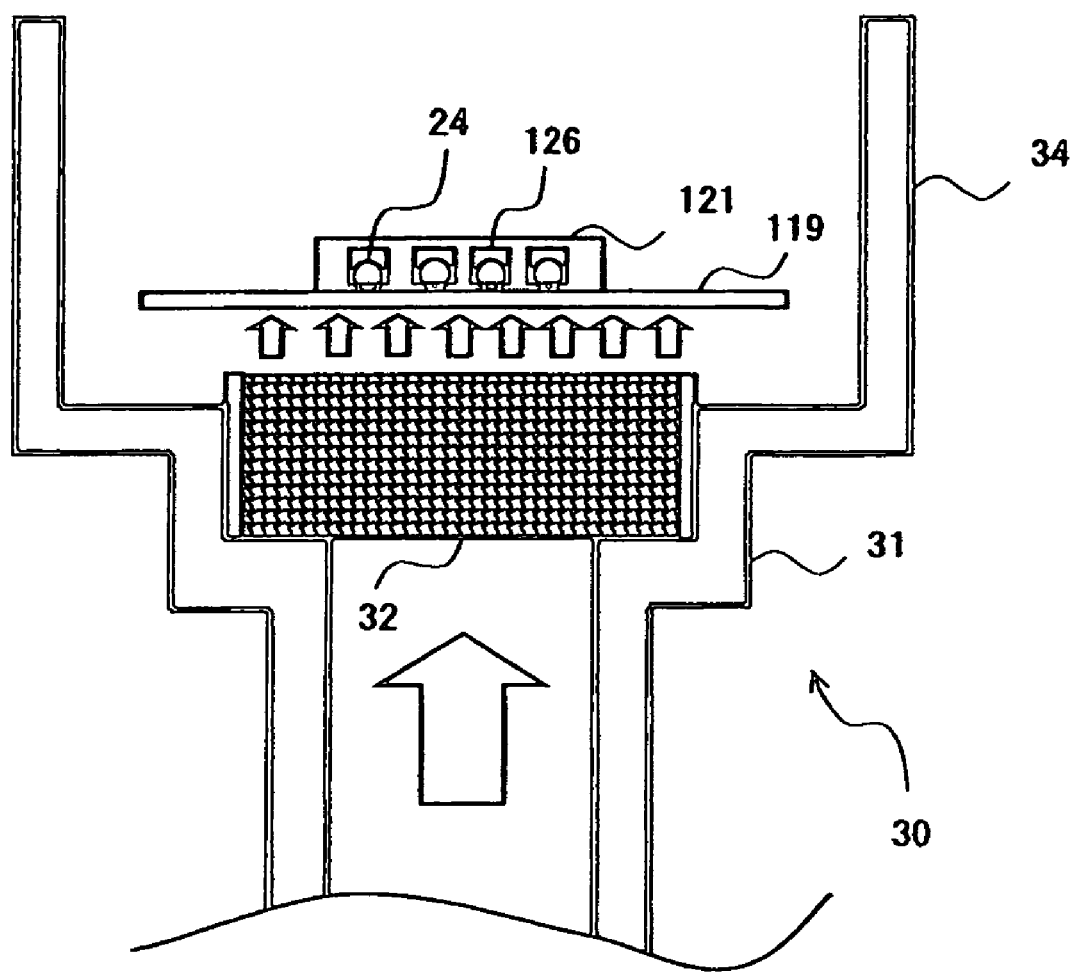
FIG. 9 is a drawing schematically illustrating another example of a nozzle for ejecting inactive gas according to one embodiment.

In the example shown in FIG. 5(a), the HGA 110 and the ejection face 321 of the porous member 32 are exposed and their peripheries are not surrounded. This structure is preferable from the view point for attaining a simpler structure of the manufacturing apparatus. On the other hand, in another example, the nozzle 30 has an extending wall 34 so as to surround at least a part of the HGA as shown in FIG. 9. The wall 34 suppresses diffusion of the inactive gas toward the periphery so that the oxygen concentration around the solder balls 24 can be maintained low with a smaller flow amount of the inactive gas.

Specifically, the wall 34 continues to and extends from the duct 31. The wall 34 has a structure that does not interfere with the HGA 110. This structure does not allow the wall 34 to inhibit the ejection face 321 of the porous member 32 from moving close to the head slider 121. Besides, it is necessary for the wall 34 not to disturb laser irradiation.

In a preferred example, the wall 34 exists both on the right and left sides of the head slider 121 (the suspension 114) as shown in FIG. 9. The length of the wall 34 is preferably larger than the one of the head slider 121. The direction of the length is parallel to the surface for mounting the head slider of the gimbal tongue 119 and orthogonal to the alignment direction of the solder balls 24. On the tip end side of the suspension 114 (the terminals 126 of the head slider 121), there is preferably no wall extended but is an open space. This prevents the wall 34 from being an obstacle to movement of the vacuum pad 70 or the laser irradiation. The shape of the space surrounded by the wall 34 is selected as appropriate from a rectangle, a half circle, and the like, as viewed from the top, depending on the design.

Figure 10A:
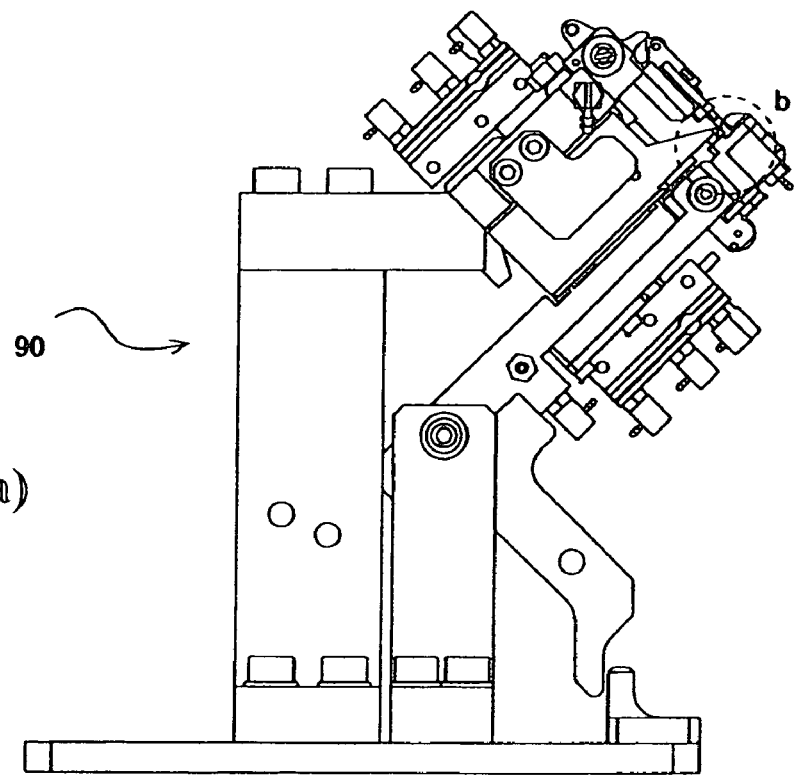
FIGS. 10(a) and 10(b) are drawings schematically illustrating a structure of a more specific example of the reflow apparatus according to one embodiment.
Figure 10B:
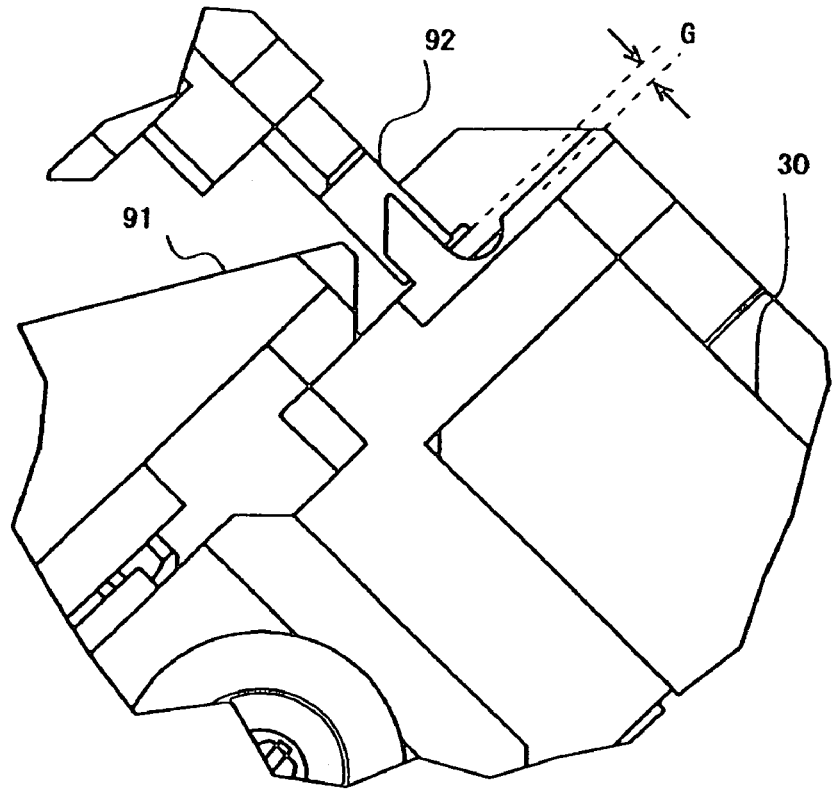

At the last, a more specific example of an HGA reflow apparatus to which embodiments of the present invention have been applied will be described referring to FIGS. 10(a) and 10(b). FIG. 10(a) is a side view of the HGA reflow apparatus 90; FIG. 10(b) is an enlarged view of the part surrounded by a circle b in FIG. 10(a). An HGA 110 is supported by an HGA supporter 91 of the HGA reflow apparatus 90 although it is not shown in the drawing. The HGA supporter 91 which is detachable from the HGA reflow apparatus 90 and to which the HGA 110 before interconnection is anchored is mounted on the HGA reflow apparatus 90. Then, solder balls 24 are placed on the HGA 110 and reflow of the solder balls 24 is performed.

The G is the gap between the ejection face 321 of the porous member 32 and the gimbal tongue 119, being same as the G shown in FIG. 5(a). The gimbal 116 of the HGA 110 (not shown) supported on the HGA supporter 91 is pushed down by a gimbal pusher 92 to be positioned. In such a state that the HGA 110 has been fixed, inactive gas ejected from the nozzle 30 is blown to the HGA 110. An optical device 60, which is not shown in the drawing, irradiates laser beam toward the solder balls 24 to reflow the solder balls 24. After completion of the reflow, the HGA supporter 91 is detached and the following manufacturing step starts.

As set forth above, the present invention is described by way of a particular embodiments, but is not limited to the above embodiments only. A person skilled in the art can easily modify, add, or convert each component of the above embodiments within the scope of the present invention. For example, embodiments of the present invention are particularly useful to an HDD, but may be applied to other types of disk drive devices. It is preferable to use lead-free solder balls for interconnection of the head slider and the suspension, but embodiments of the present invention can be applied to reflow of other types of solder balls. The number of solder balls may vary depending on the design of the HGA.

What is claimed is:

1. An apparatus for manufacturing a head gimbal assembly comprising:

an apparatus for aligning solder balls between connection terminals of a head slider disposed on a suspension and connection terminals of the suspension;

a nozzle having a porous member for blowing inactive gas and ejecting the inactive gas from an ejection face of the porous member toward the solder balls coupling (a) the connection terminals of the head slider and (b) the connection terminals of the suspension, a space between the suspension and the ejection face of the porous member and defined by projecting the suspension from the head slider toward the ejection face of the porous member being vacant; and a laser device for irradiating laser to the solder balls in an atmosphere of the inactive gas from the nozzle.

2. The apparatus for manufacturing a head gimbal assembly according to claim 1, wherein the head slider is placed on a tongue of the suspension;
the nozzle is positioned opposite the head slider across the tongue; and
the laser device is positioned opposite the tongue across the head slider.

3. The apparatus for manufacturing a head gimbal assembly according to claim 2, wherein the nozzle has a wall surrounding at least a part of the periphery of the head gimbal assembly.

4. The apparatus for manufacturing a head gimbal assembly according to claim 1, wherein a vacancy rate of the porous member is from 70% to 90%.

5. The apparatus for manufacturing a head gimbal assembly comprising:

an apparatus for aligning solder balls between connection terminals of a head slider disposed on a suspension and connection terminals of the suspension;

a nozzle having a porous member for blowing inactive gas and ejecting the inactive gas from an ejection face of the porous member toward the solder balls, a space between the suspension and the ejection face of the porous member and defined by projecting the suspension from the head slider toward the ejection face of the porous member being vacant; and a laser device for irradiating laser to the solder balls in an atmosphere of the inactive gas from the nozzle, wherein a distance between the ejection face of the porous member and the tongue is 1 mm or less.

* * * * *